United States Patent [19]

King et al.

[11] Patent Number: 5,652,055

[45] Date of Patent: Jul. 29, 1997

[54] MATCHED LOW DIELECTRIC CONSTANT, DIMENSIONALLY STABLE ADHESIVE SHEET

[75] Inventors: David R. King, Elkton, Md.; Gary C. Adler, Newark, Del.; Joseph E. Korleski, Newark, Del.; Michelle M. H. Waters, Hockessin, Del.

[73] Assignee: W. L. Gore & Associates, Inc., Newark, Del.

[21] Appl. No.: 418,708

[22] Filed: Apr. 7, 1995

Related U.S. Application Data

[63] Continuation of Ser. No. 277,805, Jul. 20, 1994, abandoned.

[51] Int. Cl.$^6$ .................... H05K 1/02; H05K 3/46
[52] U.S. Cl. ............. 428/343; 156/307.7; 174/259; 174/138 G; 428/349; 428/354; 428/422; 428/901
[58] Field of Search ................... 428/422, 421, 428/343, 354, 901, 349; 156/307.7; 174/259, 138 G

[56] References Cited

U.S. PATENT DOCUMENTS

| | | | |
|---|---|---|---|
| 3,953,566 | 4/1976 | Gore | 264/288 |
| 4,008,300 | 2/1977 | Pomm | 264/104 |
| 4,265,775 | 5/1981 | Aakalu et al. | 252/573 |
| 4,518,737 | 5/1985 | Traut | 524/413 |
| 4,557,957 | 12/1985 | Manniso | 428/36 |
| 4,574,879 | 3/1986 | Degree et al. | 165/185 |
| 4,598,011 | 7/1986 | Bowman | 428/222 |
| 4,602,678 | 7/1986 | Fick | 156/79 |
| 4,606,962 | 8/1986 | Reylek et al. | 428/148 |
| 4,669,954 | 6/1987 | Habarou et al. | 415/174 |
| 4,810,563 | 3/1989 | Degree et al. | 428/209 |
| 4,820,376 | 4/1989 | Lambert et al. | 156/643 |
| 4,849,284 | 7/1989 | Arthur et al. | 428/325 |
| 4,853,763 | 8/1989 | Degree et al. | 357/81 |
| 4,902,857 | 2/1990 | Cranston et al. | 174/94 R |
| 4,961,064 | 10/1990 | Hara | 338/231 |
| 4,985,296 | 1/1991 | Mortimer | 428/220 |
| 4,996,097 | 2/1991 | Fischer | 428/220 |
| 4,999,741 | 3/1991 | Tyler | 361/387 |
| 5,001,302 | 3/1991 | Atsumi | 174/94 R |
| 5,024,871 | 6/1991 | Arthur et al. | 428/209 |
| 5,028,984 | 7/1991 | Ameen et al. | 357/72 |
| 5,034,801 | 7/1991 | Fischer | 357/72 |
| 5,045,249 | 9/1991 | Jin et al. | 264/24 |
| 5,060,114 | 10/1991 | Feinberg et al. | 361/387 |
| 5,061,548 | 10/1991 | Arthur et al. | 428/209 |
| 5,084,211 | 1/1992 | Kawaguchi et al. | 252/511 |
| 5,137,283 | 8/1992 | Giarrusso et al. | 277/1 |
| 5,149,590 | 9/1992 | Arthur et al. | 428/421 |
| 5,194,326 | 3/1993 | Arthur et al. | 428/325 |
| 5,198,295 | 3/1993 | Arthur et al. | 428/323 |
| 5,209,967 | 5/1993 | Wright et al. | 428/283 |
| 5,213,868 | 5/1993 | Liberty et al. | 428/131 |
| 5,227,230 | 7/1993 | McGlade | 428/319.1 |
| 5,281,466 | 1/1994 | Arthur et al. | 428/195 |
| 5,354,611 | 10/1994 | Arthur et al. | 428/325 |

FOREIGN PATENT DOCUMENTS 2195269  4/1988  United Kingdom.

OTHER PUBLICATIONS

Data Sheet: "Adhesive Interconnect System 5303R Z–Axis Adhesive Film (AZF);" 3M; Jan. 5, 1993; Rev. 002.

(List continued on next page.)

*Primary Examiner*—James C. Cannon
*Attorney, Agent, or Firm*—Victor M. Genco, Jr.

[57] ABSTRACT

The present invention is an improved adhesive sheet (also known as a "bond ply," "bond film," or "prepreg") material suitable for bonding together electric circuit boards and other electrical components. The adhesive sheet of the present invention comprises a combination of a porous expanded polytetrafluoroethylene (PTFE), a ceramic filler, and a thermoset resin imbibed within the porous PTFE structure. By employing a fill of less than about 60% by weight of resin, the adhesive sheet has exceptionally good performance characteristics while being vastly easier to process.

12 Claims, 5 Drawing Sheets

OTHER PUBLICATIONS

"Effective Polymer Adhesives For Interconnect" by Kreutter, et al.; 3M; Date: (unknown).

NUGGETS Unitek Equipment Technical Services Bulletin 9202A; Unitek Equipment, Inc., 3M Anisotropic (Conductive) Adhesive.

Article: "Z–Axis Adhesive Film: Innovation in Electronic Interconnection;" Bruce Grove; InterConnection Technology, Dec. 1992.

"Portable Electronics Packaging Project;" Microelectronics and Computer Technology Corporation; Bert Haskell; Sep. 1992.

"Interconnection Method of Liquid Crystal Driver LSIs by Tab–On–Glass and Board to Glass Using Anisotropic Conductive Film and Monosotropic Heat Seal Connectors;" Roger R. Reinke, Elform, Inc.; pp 1–7.

CHO–THERM R Thermal Interface materials; Grace Company; Date: unknown.

"Prediction and Measurement of Thermal Conductivity of Diamond Filled Adhesives;" by Justin C. Bolger, Emerson & Cuming; pp. 219–224; 1992.

"Silicones with Improved Thermal Conducitity for Thermal Management in Electronic Packaging;" Adam L. Peterson; Dow Corning Corp.; pp. 613–661–; date–unknown.

"SIL–PAD R Design Guide;" The Bergquist Company; Date: Spring, 1993, pp. 1–23.

"Elastomeric Connector User Design Card;" PCK Elastomerics, Inc.; date–unknown.

MATCHED LOW DIELECTRIC CONSTANT, DIMENSIONALLY STABLE ADHESIVE SHEET

RELATED APPLICATIONS

This application is a continuation of U.S. patent application Ser. No. 08/277,805, filed Jul. 20, 1994, now abandoned.

BACKGROUND OF THE INVENTION

1. Field of the Invention

The present invention relates to adhesive sheets suitable for use in the construction of circuit boards and other electrical devices.

2. Description of Related Art

Multi-layer Printed Circuit boards are presently made out of two basic dielectric components. The circuitry is etched onto copper clad dielectric substrates that make up one of those components. The other component, referred to as a prepreg, bond ply, or bonding film, is an adhesive layer that is used to attach the etched substrates together to form the multi-layer structure.

Traditionally, a woven glass reinforced epoxy has been the material of choice for multi-layer printed circuits. The material is easy to work with, inexpensive, and has fairly good electrical properties. In areas that require higher performance, like high speed digital or microwave applications, the electrical properties of the epoxy are not sufficient and an alternative must be used.

The highest performance of the low dielectric substrates currently available are made from a composite of polytetrafluoroethylene (PTFE) and glass or ceramic. Though this material is difficult to process, its excellent electrical properties make it ideal for many of the higher frequency circuits (above 400 MHz). Due to required high pressures and temperatures for processing into a composite, this material has gained wide acceptance as a copper clad substrate, but only limited acceptance as a bond ply.

The second component of these high performance, multi-layer circuits, the bond ply, has traditionally been a thermoplastic film that is much easier to process and requires much lower pressures and temperatures than bonding with the PTFE. The high temperatures and pressures associated with PTFE bonding or "sintering" can be very inconvenient, and often impossible to employ. Additionally, such extreme processing introduces large amounts of thermal and mechanical stress into the circuit board. In addition, filled PTFE materials have poor flow characteristics which limit the ability of the bonding film to conform around the etched circuitry on the substrates being bonded together. Though thermoplastic bond plies have advantages over PTFE bonding by reducing processing temperatures and pressures while increased flow characteristics, they have several inherent limitations.

One limitation of thermoplastic bonding films is that they do not match the dielectric constant of the substrates that they are bonding together. This difference in properties causes problems for very high frequency and high performance circuits. The propagating electromagnetic signal is not only affected by the overall dielectric constant (Dk) of the PWB, but is also strongly affected by local changes of the dielectric constant. An improperly Dk-matched system leads to unreliable signal propagation and unreliable signal integrity.

Another limitation is that the nature of thermoplastics is such that they will always flow at a given temperature. Multi-layer circuits that require a sequential lamination operation (i.e., more than one bonding operation) require the use of different thermoplastic bonding films. This is needed because if the temperature of the previous bond film is reached, then that previous joint will reflow, causing misregistration of the inner layer substrates.

This may lead to another limitation. There are only a few thermoplastic bonding films on the market that operate at different temperatures and meet the electrical requirements of these high performance circuits. This limits the number of sequential laminations that can be done for a given circuit. The lowest temperature of these films bonds at 250° F., but loses about 85% of its strength at 180° F. That means that if the finished circuit is going to need to go through high temperature operations like soldering, then there are only a couple of bonding film options. It would be desirable, therefore, to have a system that would allow for sequential laminations and not have the same temperature limitations of the finished circuit.

Another common problem with these materials is that the thermoplastics have coefficients of thermal expansion (CTE) that are three to four times as high as the CTE of the substrate. Failure to match these characteristics properly often leads to excessive stress within the board, premature separation of the adhesive layer, inconsistent electrical performance, and unreliable plated-through-holes.

Despite these limitations, thermoplastic bond plies continue to be used because no acceptable substitute has been found. The function of this component is to hold the substrates of a multi-layer circuit together while providing the necessary electrical and physical properties to produce an optimized circuit. While thermoplastic systems have problems with unmatched Dk and poor processing, thermoset systems have had problems with unmatched Dk, high dielectric loss, and poor adhesion to the PTFE substrates.

U.S. Pat. No. 4,518,737 to Traut describes an isotropic composite of a fluoropolymer binder and ceramic filler, which contains both microfiber and particulate, especially in the range of 10 and 75 weight percentage. U.S. Pat. No. 4,849,284 to Arthur describes electrical substrates comprising fluoropolymer and a ceramic filler where the filler is at least 55% by weight. Although these composites may display good electrical and dimensional stability, making them good copper clad substrate materials, they are difficult to process and display markedly difficult rheology for flow and fill into the inter spacings of a circuit board. Though a bond ply made of the same material would have a good Dk match, it would have poor flow characteristics and undesirable processing conditions. They are poor bond films.

A number of further refinements to this basic technology have been proposed in subsequent patents, but none is believed fully satisfactory. For example: zirconate surface treatment is taught in U.S. Pat. No. 5,024,871 to Arthur et al.; silane surface treatment on a ceramic filler is taught in U.S. Pat. No. 5,149,590 to Arthur et al.; fluoropolymer and ceramic composites with a silane coating in the range of 45–50% by volume percent is taught in U.S. Pat. No. 5,194,326 to Arthur et al.; a titanate or zirconate filler is taught in U.S. Pat. No. 5,198,295 to Arthur et al.; and a bond-ply of ceramic-filled fluoropolymer with a ceramic coated with a coupling agent is taught in U.S. Pat. No. 5,281,466 to Arthur et al. Among the deficiencies with each of the above products are believed to be only slightly improved rheological flow to fill gaps and traces within inner layers of the circuit boards (i.e., they are still poor bond films). In the case of U.S. Pat. No. 5,281,466, lower filler levels are used to increase the flow characteristics, but at the expense of the Dk and CTE match.

Moreover, in each of the prior examples, the method for making a useful article is by bonding the PTFE in said composites at so-called "sintering" temperatures (i.e., very high temperatures and pressures on the order of above 662° F. (350° C.) and 1000 lb/in$^2$ (678 N/cm$^2$). As previously discussed, this difficulty in processing has prevented these composites from gaining widespread use as a bond ply.

In U.S. Pat. No. 4,985,296 to Mortimer, it is taught that an expanded PTFE film 0.1 to 5.0 mil thick can be filled with an inorganic filler while remaining substantially pin hole free. U.S. Pat. No. 4,996,097 to Fischer teaches similar technology useful for a thin capacitive layer in a printed circuit board. While these products have better flow characteristics, they still maintain the high pressures and temperatures that make them undesirable as bond plies.

All of the above examples teach methods of producing a material with good electrical and physical properties, but they all maintain the high temperatures and pressures that preclude them from having the desirable processing for a bonding film.

Thermosetting resins have traditionally provided ease of processing in making multi-layer circuits. An approach to making a bonding film involves using various fillers that have been added to thermosetting adhesives to improve performance characteristics, particularly with regard to matching coefficients of thermal expansion of component parts. For example, silicon dioxide (SiO$_2$) particles are commonly employed to provide a variety of improved performance characteristics, such as lower coefficient of thermal expansion (CTE) and more desirable shrinkage performance.

Unfortunately, even the filled adhesive approach to bonding films has a number of performance and handling deficiencies. The resins used in combination with the fillers provide good adhesion, but have very poor electrical performance. Loading the adhesive with filler makes the adhesive film brittle and difficult to handle. Therefore, to date there has been no practical way to deliver the desired properties with a filled thermosetting resin.

To aid in the application of adhesives, a number of adhesive materials have been incorporated into a carrier sheet to form an adhesive "bond film." For instance, W. L. Gore & Associates, Inc., sells a bond film material under the trademark SPEEDBOARD that comprises an expanded polytetrafluoroethylene (PTFE) matrix (such as that made in accordance with U.S. Pat. No. 3,953,566 to Gore) filled with an adhesive resin material. This product forms a good bond for most applications and is easy to handle and apply. Nevertheless, further performance improvements remain of interest, particularly with regard to better matches in dielectric constant at microwave frequencies and the coefficients of thermal expansion.

In UK Patent 2,195,269 to Hatakayama et al. a composite of porous PTFE substrate with resin imbibed within its node-and-fibril structure is taught. While this patent also mentions that an inorganic filler may be incorporated in the expanded, porous PTFE, the ranges of fill taught by the patent (i.e., about 25–45% volume ceramic and about 25–40% volume adhesive) have proven ineffective in addressing the Dk match, flow characteristics and adhesion necessary to make an acceptable bonding film for PTFE substrates.

The Fisher patent also teaches that resin can be imbibed into a ceramic filled PTFE structure, but again, the product in that form would still not have the Dk match, flow characteristics, and adhesion necessary to make an acceptable bonding film for PTFE substrates.

Despite previous attempts to produce suitable material, no prior composite has provided all of the desired properties and processability for any given combination of ceramic (or other fillers), PTFE and resin.

Accordingly, it is a primary purpose of the present invention to provide an adhesive material that is dimensionally stable and has a relatively matched dielectric constant with its substrate (or "core") material.

It is a further purpose of the present invention to provide an adhesive bond film material that can be processed at relatively low temperatures and pressures so as not to introduce additional stress into a circuit board or other electrical structure.

It is still further the purpose of the present invention to provide an adhesive bond film material that allows for a successive fabrication of multi-layer PWB for microwave applications.

These and other purposes of the present invention will become evident from review of the following specification.

SUMMARY OF THE INVENTION

It has now been determined that very thin, well-controlled thickness adhesives can be obtained using a particular construction of thermosetting resin and ceramic-filled expanded porous polytetrafluoroethylene (PTFE). Unusually high performance in regard to combining electrical and dimensional properties with processability can be achieved at low loadings of ceramic filler. This is unexpected because it is commonly believed that such compositions result in undesirable properties.

For example, U.S. Pat. No. 4,849,284 to Arthur explains that coefficient of thermal expansion and dimensional stability gradually becomes more desirable with increasing ceramic level. The respective properties do not become desirable until a filler level of >55% is attained. U.S. Pat. No. 5,281,466 to Arthur, however, teaches that lowering the ceramic is needed to get desirable flow properties, but this is done at the expense of decreasing the Dk, raising the CTE, and lowering the dimensional stability. These patents teach, therefore, that flow characteristics comes at the expense of properties, or vice versa. Although it should be stressed that neither of those composition ranges provide the desired level of processability.

In the present invention it has been determined that the desired balance of good electrical performance, good physical properties, and, most importantly, ease of processing can be produced in a bond ply through the use of a surprisingly low percentage of ceramic filler, in a range of 9 to 60% by weight. This is unexpected since previous studies have indicated that reducing the amount of ceramic filler increases the amount that the material will flow and increases the coefficient of thermal expansion significantly. In the present invention, excellent properties are obtained without sacrificing in rheological, electrical, or thermal expansion properties.

One of the chief benefits of the bond film construction of the present invention is dramatically improved processing characteristics. While previous attempts to produce a filled porous PTFE material as a bond film have generally required extreme processing temperatures and/or pressures, the bond film of the present invention achieves remarkable bonds while operating at temperatures and pressures in the range of less than 446° F. (230° C.) and less than 250 lb/in² (170 N/cm²). These more reasonable processing conditions provide far greater flexibility in circuit board construction techniques, such as the bonding together of multiple layers of a board sequentially.

An important benefit of the bond film construction of the present invention is the ability to match the Dk of the bond ply to that of the substrate material. The low impedance and dissipation thus obtained are ideal for constructing microwave circuits.

DESCRIPTION OF THE DRAWINGS

The operation of the present invention should become apparent from the following description when considered in conjunction with the accompanying drawings, in which.

DETAILED DESCRIPTION OF THE INVENTION

The present invention is an improved adhesive sheet or "bond film" material suitable to serve as adhesive layers in a variety of adhesive applications, such as in circuit board laminates, multi-chip modules, and in other electrical applications.

The adhesive sheet of the present invention is constructed from an expanded polytetrafluoroethylene (PTFE) material, such as that taught in U.S. Pat. No. 3,953,566 to Gore. Preferably, the material is filled with an inorganic filler and is constructed in the following manner:

A ceramic filler is incorporated into an aqueous dispersion of dispersion-produced PTFE. The filler in small particle form is ordinarily less than 40 microns in size, and preferably less than 15 micron. The filler is introduced prior to co-coagulation in an amount that will provide 10 to 60%, and preferably 40 to 50% by weight filler in the PTFE in relation to the final resin-impregnated composite. The filled PTFE dispersion is then co-coagulated, usually by rapid stirring. The coagulated filled PTFE is then added. The filled material is then lubricated with a common paste extrusion lubricant, such as mineral spirits or glycols, and then paste extruded.

The extrudate is usually calendered, and then rapidly stretched to 1.2× to 5000×, preferably 2× to 100×, at a stretch rate of over 10% per second at a temperature of between 35° C. and 327° C. The lubricant can be removed from the extrudate prior to stretching, if desired.

The resulting expanded, porous filled PTFE is then imbibed with adhesive by dipping, calendering, or doctor blading on a varnish solution of about 2% to 70% adhesive in solvent. The wet composite is then affixed to a tenter frame, and subsequently B-staged at or about 165° C. for 1 to 3 minutes. The resulting sheet adhesive thus obtained typically consists of: 9 to 65 weight percent PTFE, 9 to 60 weight percent inorganic filler, in the form of particulate; and 5 to 60 weight percent adhesive imbibed within the porous structure of the filled PTFE web.

Figure 1:
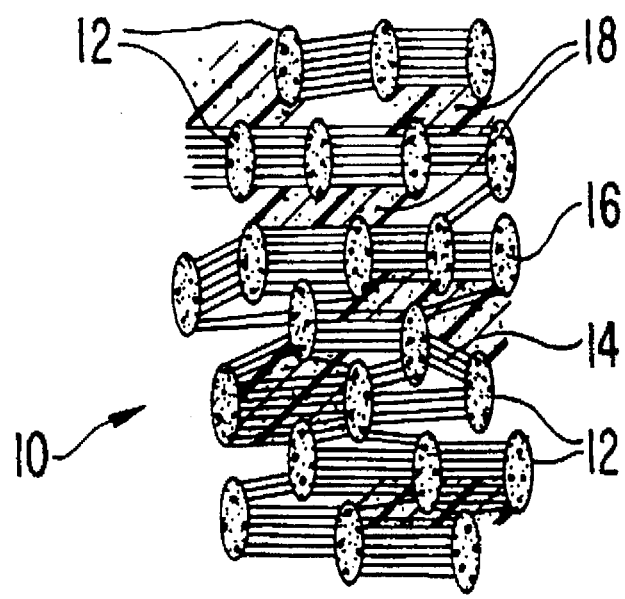
FIG. 1 is a partially schematic representation cross-section of a bond film of the present invention, showing the polymeric nodes and fibrils of expanded polytetrafluoroethylene structure as well as the ceramic particles and adhesive resin loaded therein.

Shown in FIG. 1 is a representation of an expanded PTFE matrix structure 10 of the present invention, comprising: polymeric nodes 12 interconnected by fibrils 14; embedded inorganic filler particles 16 (e.g., $SiO_2$); and filled adhesive resin 18.

To facilitate formation of the thin film sheets of the present invention, the particulate size of the filler particles 16 should average 40 microns or less. By "particulate" is meant individual particles of any aspect ratio and thus includes fibers and powders. Examples of suitable fillers for use in the present invention include: fused silica, fumed silica, silica microfibers, crushed quartz, and glass or polymeric microspheres.

To prepare the adhesive sheet 10 of the present invention, particulate filler 12 is mixed into an aqueous dispersion of dispersion-produced PTFE. The filler in small particle form is ordinarily less than 40 microns in size, and preferably has an average particulate size between 1 and 15 microns. The filler is introduced prior to coagulation in an amount that will provide 25 to 85, preferably 40 to 85, weight percent filler in the PTFE in relation to each other after the PTFE is coagulated and expanded.

The filled films are imbibed with resin 18. In this case, all or part of the void volume comprising of air is replaced with a thermosetting or thermoplastic resin. Where only part of the void volume of air is replaced with resin, the final composite can be compressed in place to a very thin, void-free composite with excellent adhesion.

Figure 2:
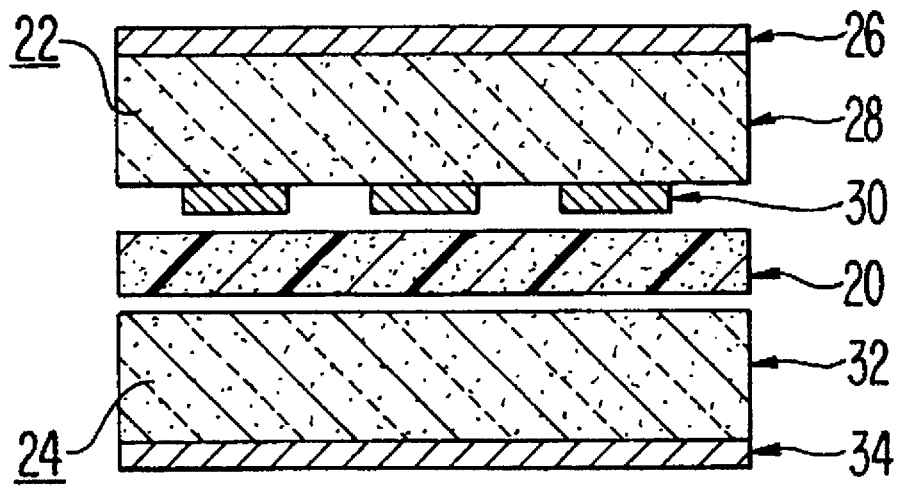
FIG. 2 is a multi-layered circuit construction utilizing a ply construction of the present invention.
Figure 3:
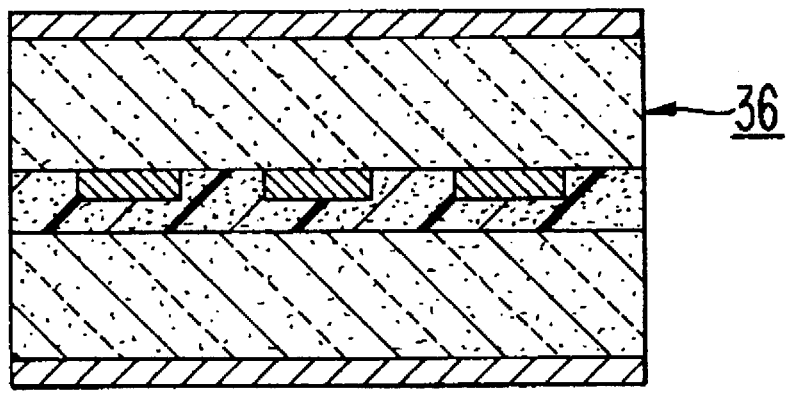
FIG. 3 is a schematic cross-section representation of the construction of FIG. 2 with the layers shown bonded together.

At this stage the material is ready to be used as a bonding film, as is shown in FIGS. 2 and 3. The standard lamination procedure for a multi-layer circuit is to place one or more sheets of the bonding film 20 between etched copper clad substrates 22, 24 and apply heat and pressure to form the bond. The substrates shown comprise: a first substrate 22, including a metal ground plane 26, a dielectric layer 28, and a circuit layer 30; and a second substrate 24 comprising a dielectric layer 32 and a metal ground plane 34. As is shown in FIG. 3, when heat and pressure are applied, these layers become a single, bonded multi-layer substrate 36.

Figure 4:
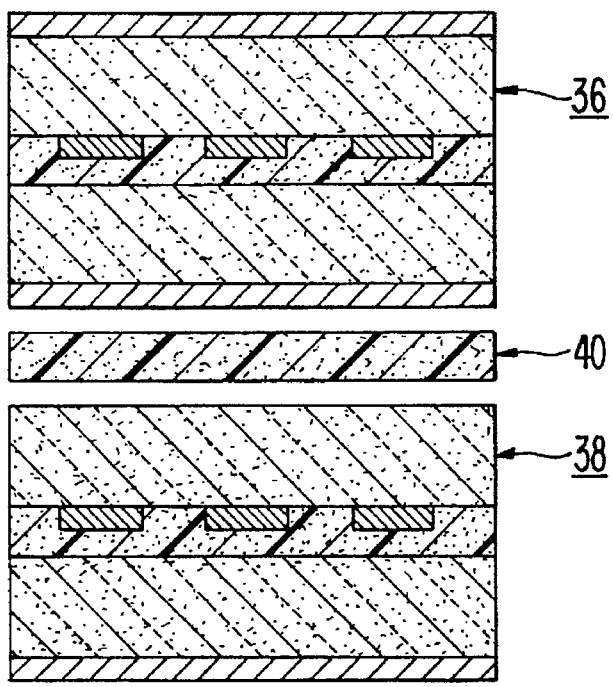
FIG. 4 is a schematic cross-section representation of the circuit construction of FIG. 3 shown multi-layered with other laminates.
Figure 5:
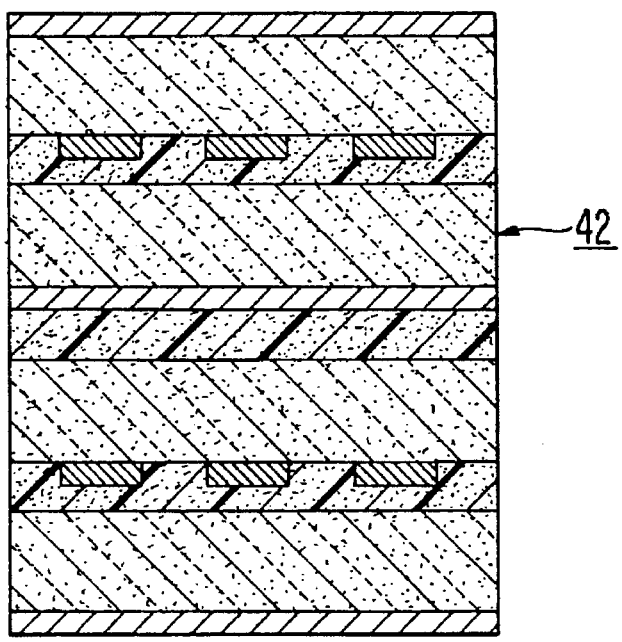
FIG. 5 is a schematic cross-section representation of the construction of FIG. 4 with the layers shown bonded together sequentially.

As is shown in FIG. 4, in a sequential lamination operation, a multi-layer structure 36, that had previously been laminated together in the manner described above, is then bonded to one or more additional etched copper clad substrates 38. To accomplish this bonding process, one or more layers of bonding film 40 is applied between substrates 36, 38. The resulting single sequentially bonded, multi-layer substrate 42 is shown in FIG. 5.

If a standard thermoplastic bonding film is used for this type of sequential lamination, then each subsequent lamination must be made at a lower temperature so as not to degrade the bond from the previous lamination. A thermosetting bonding film, on the other hand, can be made at the same temperature without degrading the previous bond.

The presence and percentage of resin are a critical issue to the formation of the bonding film. Previous attempts to produce a bonding film have been nonporous, which precludes the use of resin. In the present invention, the resin is critical to providing the processing advantages of thermoset processing (e.g., lower temperature, lower pressures, sequential laminations), but the electrical and mechanical properties are primarily controlled by the PTFE and the filler. It is necessary, therefore, that resin be used in sufficient proportion to provide adhesion, but not in abundance so that the electrical or mechanical properties are adversely effected. The composition described in this invention is unique in that it allows for the presence of resin as well as allowing latitude in being able to tailor the DK to match the substrates being bonded. It is important to be within the range of 9–60 weight percent ceramic, and about 5–60 weight percent adhesive in order to achieve desirable electrical and dimensional properties.

Figure 6:
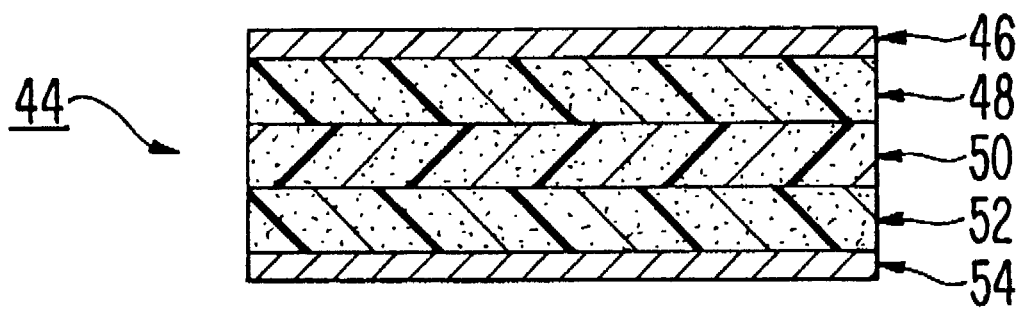
FIG. 6 is a schematic cross-section representation of a dielectric substrate material of the present invention including a metal foil layer.

Shown in FIG. 6 is a metal clad substrate 44, similar to that shown in FIG. 2 as substrates 22 and 24. In this instance, the substrate 44 comprises a first metal foil layer 46, multiple plies of bonding film layers 48, 50, 52 of the present invention, and a second metal foil layer 54. This material can then be used to have circuits etched on to it, allowing it to be formed into a multi-layered structure as described above. The substrate 44 may be formed from any number of layers of bonding film of the present invention. Metal may be attached to one or both sides of the substrate and may likewise be single or multiple layers.

Figure 7:
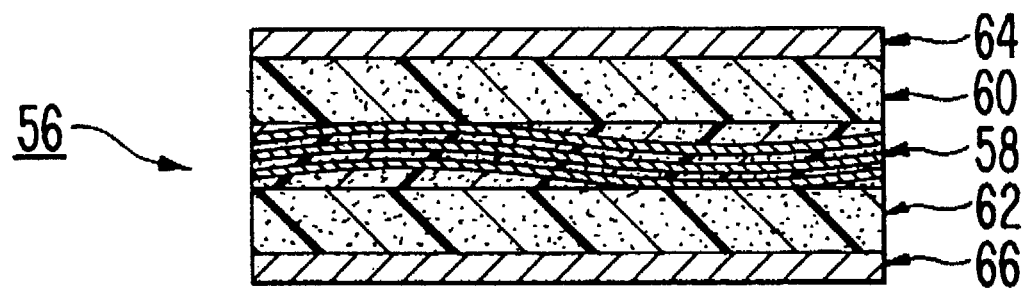
FIG. 7 is a schematic representation of a cross-section of dielectric substrate material of the present invention including a layer of reinforcement material.

FIG. 7 is a metal clad substrate 56 of the present invention including the addition of a reinforcement layer 58 between bonding layers 60 and 62. Again, metal foil 64 and 66 is attached to both upper and lower surfaces of the substrate. By supplying one or more reinforcement layers 58, additional properties can incorporated into the substrate. Such enhanced properties may include added mechanical strength, dimensional stability, modified coefficient of thermal expansion, etc. The reinforcement layer may comprise any suitable material, including woven or non-woven glass, quartz, PTFE, ceramic, or other fabric.

Suitable metal foils for use with the present invention may include copper, nickel, silver, gold, aluminum, platinum, palladium, etc.

The performance of the bond film of the present invention as compared with other bonding materials is depicted in Table 1, as follows:

| Material | $\epsilon\tau$ | Vp (%) | $\Delta\Phi$* |
|---|---|---|---|
| Air | 1.0 | 1.00 | |
| PTFE | 2.0 | 70.7 | |
| FEP film | 2.1 | 69 | 22° |
| Co-polymer film | 2.3 | 65.9 | 16° |
| PTFE/ceramic composite | 3.0 | 57.7 | 0° |
| Present Invention | 3.0 | 57.7 | 0° |

*°/inch at 50 ohms

Table 1 illustrates the electrical properties of various materials. A mismatch in dielectric constant changes the electrical lengths of any controlled impedance microstrip line. There is a significant phase difference ($\Delta\Phi$) between the bond film of the present invention and the other types of bonding films shown in the table when used in conjunction with a PTFE/ceramic composite material, such as that shown in FIGS. 2 and 3.

Figure 8:
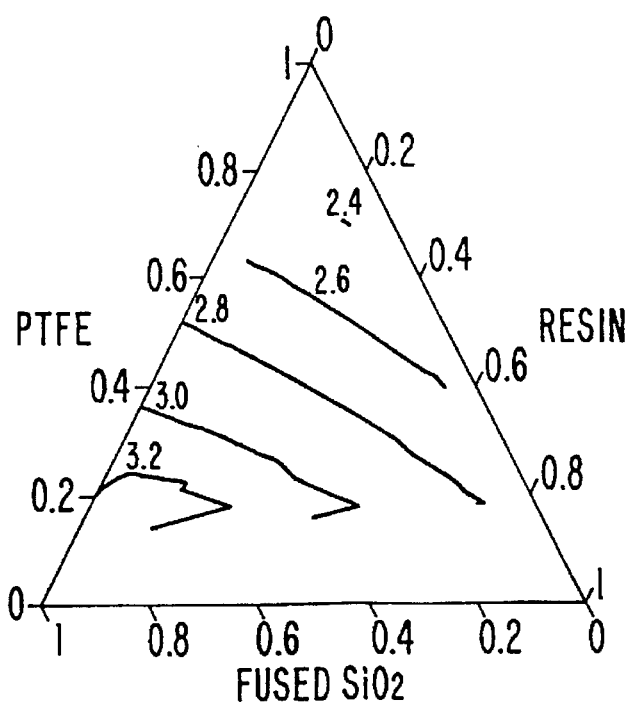
FIG. 8 is a graphical representation showing the effect of loading of various volume percentages of resin, ceramic filler, and expanded PTFE with regard to the dielectric constant (Dk) of the final bond film material.
Figure 9:
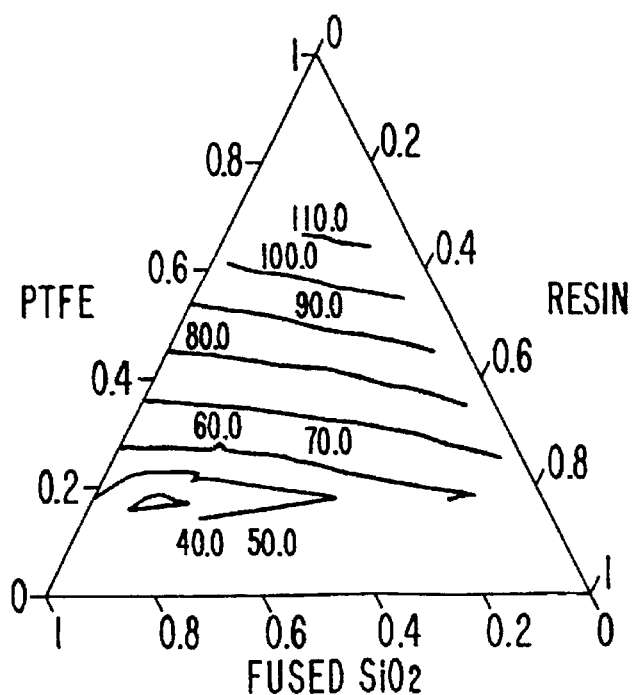
FIG. 9 is a graphical representation showing the effect of loading of various volume percentages of resin, ceramic filler, and expanded PTFE with regard to coefficient of thermal expansion (CTE) of the final bond film material.

The selection of materials to form a bond ply of the present invention can be better understood with reference to the graphs of FIGS. 8 and 9. FIG. 8 is a compositional plot of the three-component mixtures of the present invention. The contour lines show the possible values of Dk attainable in the present invention by tailoring the relative amounts of the components. The contours were calculated based off the log rule of mixtures equation, i.e., $\ln(Dk_{composite}) = S\ [v_i * \ln(Dk_i)]$; where $Dk_{composite}$ = the Dk of the final composite, $v_i$ = the volume fraction of the $i^{th}$ component, $Dk_i$ = the Dk of the $i^{th}$ component. The contour lines demonstrate that $Dk_{composite}$ of the present invention can be tailored from 2.4 up to 3.2.

Table 2 is a summary of weight and volume fraction percentages of measured values of dielectric constant on three different samples of the present invention:

| # | Composition (weight %) | | | Pobs (g/cc) | Dk |
|---|---|---|---|---|---|
| | SiO2 | PTFE | Resin | | |
| Example 1 | 52 | 48 | 0 | 1.93 | 2.5 |
| Example 2 | 40 | 36 | 24 | 1.7 | 2.8 |
| Comparative Example | 30 | 27 | 43 | 1.76 | 2.9 |

Observed Density ($\rho_{obs}$) was calculated by dividing the observed weight in grams by the calculated volume in cubic centimeters (cc). The volume of the sample was calculated by multiplying the average thickness, length and width. Each average comprised of at least 3 separate measurements. The uncertainty associated with these measurements was carded throughout the calculations.

Prepreg Resin Content (RC) was calculated by dividing the weight of a swatch of prepreg into the weight of the same swatch after exhaustively extracting out all adhesive with solvent, allowing the swatch to dry, and weighing.

Weight fraction of each component was determined by first determining the resin content directly by extraction. Separately, compositional make-up of the substrate was independently checked both by the relative weight percentages of the components actually mixed, and by thermal-gravimetric analysis. The relative composition of each component was then calculated from the following equation: % ith component=(1-Resin Content) * (% ith component in substrate).

Dielectric constant (Dk) at frequencies less than 3 GHz was obtained using a Hewlett-Packard 8753A Network Analyzer (Hewlett-Packard Corp., San Jose, Calif.) by the substrate resonance method on a copper-clad laminate.

Dielectric constant (Dk) and Dissipation Factor (Df) at frequencies above 5 GHz was obtained using a resonant mode dielectrometer developed by GDK Products (GDK Products Inc., Cazoniva, N.Y.) and a Hewlett Packard 8510 Network Analyzer (Hewlett-Packard Corp., San Jose, Calif.).

Copper Peel values were determined using a 90° peel configuration on a copper-clad laminate anchored to a rigid sliding plane substrate coupled to an Applied Test Systems Model No. 1401 computer-controlled tensile testing machine (Applied Test Systems Inc., Butler, Pa., U.S.A.).

FIG. 9 is a compositional plot of the three-component mixtures of the present invention. The contour lines show the possible values of coefficient of thermal expansion (CTE) attainable in the present invention by tailoring the relative amounts of the components. The contours were calculated based off the log rule of mixtures equation, i.e., $\ln(CTE_{composite}) = S\,[v_i * \ln(CTE_i)]$; where $CTE_{composite}$=the CTE of the final composite, $v_i$=the volume fraction of the $i^{th}$ component, $CTE_i$=the CTE of the $i^{th}$ component. The contour lines demonstrate that $CTE_{composite}$ can be theoretically tailored from 40 to 110 ppm/°C. Particularly successful samples of the present invention have been produced in the range of 25 to 65 ppm/°C.

PTFE and ceramic composites show good electrical properties but very poor processing and are constrained to the left-most axis of FIG. 8. Ceramic-filled adhesives display undesirable electrical properties but desirable processing, and are constrained to the bottom axis. PTFE-adhesive composites, constrained to the right-most axis, display relatively desirable electrical and processing properties, but lack the ability to tailor the DK to match various substrates.

A thermosetting bond film with matched Dk to that of its core allows for convenient sequential build-up of layers to fabricate a multi-layer circuit board. This has been illustrated in FIGS. 2 through 5 showing step-wise fabrication of inner layers and their bonding together to a multi-layer board. This ease of fabrication has not yet been available for microwave applications because of the rigorous requirements on both electrical and processing performance.

Lamination Process:

One of the more important benefits of the present invention is its versatility, especially as it relates to various lamination processes. A common construction in multi-layer structures involves a stripline configuration. A stripline is usually formed by taking two substrates. One substrate is comprised of a dielectric with a copper ground on one side and copper circuitry on the other side. The other substrate is comprised of a dielectric with a copper ground on one side and no metal on the other side. The two substrates are then bonded together so that the copper circuitry is between the two ground planes. This construction is illustrated in FIGS. 2 and 3.

Since there are no thermosetting adhesives at present that offer the necessary low dielectric constant and loss characteristics necessary for high performance, high frequency circuits, the adhesives that are currently used are thermoplastic bonding films.

Currently, there are about four (4) commercially available thermoplastic adhesives that meet the electrical performance requirements. The best electrical match is a PTFE based bond ply or direct fusion that requires 1000 psi (678 N/cm²) @662° F. (350° C.). Many presses and press pads have temperature limitations of 483° F. (250° C.). Similarly, many autoclaves have pressure limitations of 100–250 psi (68–170 N/cm²). This makes use of the PTFE bond ply or direct fusion impractical if not impossible by many companies with existing equipment.

The other three thermoplastics bond at about 250° F. (121° C.), 450° F. (232° C.) and 550° F. (288° C.) with 100–250 psi (68–170 N/cm²) typically being used. The drawback with these materials is that they reflow when brought back up to the bonding temperature. For instance, the 250° F. (121° C.) bonding film loses about 85% of its strength at 180° F. (82° C.). That means that bonding film will not hold up to standard lead/tin soldering operations that are predominately used to mount components or connectors to the substrate.

In a multi-layer structure that uses several stripline configurations, it is often necessary to use multiple bonding cycles. Present technology only allows for about four laminations in the best case (i.e., one for each commercially available material). If special pressing technology is not available, the PTFE bond ply or direct fusion cannot be used. If the printed circuit board must withstand a soldering operation, then that leaves only two possible bonding operations. This severely restricts the fabrication versatility by limiting the order in which layers can be etched and added into the multi-layer board. Some high performance digital circuit boards can have over five or six separate bonding steps.

The need for multiple laminations arises from the need to limit the layers that plated thru holes used in the board. Plated thru holes are used for interconnecting one layer of metal to another and are accomplished by drilling a hole and coating the inside of the hole with metal. The drilled hole diameter is usually twice as wide as the circuit trace it attaches to, and increases in diameter based on how many dielectric layers it must pass thru. A hole that goes through 12 layers must be much bigger than one that only goes through 2 layers. The hole also uses up that diameter of space on every layer it passes through. So if the circuit requires that one layer (e.g., Layer No. 2) be connected to another closely oriented layer (e.g., Layer No. 4), and the board has multiple other layers (e.g., 12 layers), then all of the layers (e.g., all 12 layers) must lose the space.

By using the versatile material of the present invention where the board may be made with multiple bonding steps, then the closely oriented layers can be bonded together, go through a plated through-hole operation, and subsequently get bonded into the multi-layer board. This can be accomplished without losing the area on the rest of the layers of the board. This technique of sequential lamination is becoming more prevalent as circuitry gets more complicated and more circuitry is needed in thinner and smaller boards.

The present invention uses a thermosetting resin that can be taken back to the bonding temperature without loss of strength and adhesion. That allows for multiple laminations without changing of materials and press cycles, and removes the limitation on the number of bonding steps for a given board.

For instance, a thermosetting resin of the present invention may be bonded at 428° F. (220° C.), which is within the capabilities of most existing press equipment and material. The pressure required is 100–350 psi (68–237 N/cm²), which is also easily accomplished with the lower pressure limitations of autoclaves. Accordingly, the material of the present invention readily allows for sequential lamination steps without the need to employ expensive or unusual equipment or processing steps.

Without intending to limit the scope of the present invention, the following examples illustrate how the present invention may be made and used:

EXAMPLE 1

A slurry of 6,851 g $SiO_2$ (Harbison & Walker, HW-11-89; first treated with a 1% (w/w) of diphenylmethyl silane, Huls #PI89), 1,305 g TEFLON PFA in the form of a 22.1% solids dispersion, and 10 liters of a 50% solution of isopropanol in deionized water was prepared in a 40 liter container. While the slurry was agitated at about 300 rpm, 4,894 g PTFE in the form of a 35.2% solids dispersion was rapidly poured into the mixing vessel. The PTFE dispersion was an aqueous dispersion obtained from dupont Company. The mixture was self-coagulating and within 5 minutes co-coagulation was complete. The coagulum was gently poured over a porous cheesecloth and allowed to air dry. The filtrate from this process was clear.

The coagulum was dried at 165° C. in a convection oven. The material dried in small, cracked cakes approximately 2 cm. thick and was chilled. The chilled cake was hand-ground using a tight, circular motion and minimal downward force through a 0.635 cm mesh stainless steel screen, then 0.19 g of mineral spirits per gram of powder was added. The mixture was chilled, again passed through a 0.635 cm. mesh screen, tumbled for 5 minutes, then allowed to sit at 18° C. for 48 hours and was rerumbled for 5 minutes.

A 7.7 pound pellet was formed in a cylinder by pulling a vacuum and pressing at 880 psi. The pellet was then heated in a sealed tube to improve lubrications and add strength. The pellet was then extruded into a 6"×0.080" tape form. The tape was then calendered through rolls to a thickness of 0.076 inch. The tape was cut half-way along its length, and the two layers plied against one another. The resultant tape was folded upon itself again to make a 4-ply tape, which was calendered to a thickness of 0.032 inch. The lubricant was evaporated by running the tape across heated rolls. The tape was stretched in the machine direction twice: first at a 2 to 1 ratio, 250° C., 40 ft/min. The second stretch is also a 2 to 1 ratio, 250° C., 40 ft/min. The expanded tape was then expanded transversely at an 8 to 1 ratio, 270° C., 40 ft/min. to attain a 60"×0.004", film. The film had no pinholes, an average weight of 49 g/m2, and porosity of 82%.

EXAMPLE 2

A swatch of film from Example 1 was then dipped into a 10% (w/w) solution of Mitsubishi BT resin, constrained in plane on a tenter frame, and heated for 2 min. at 163° C. The composite of the resultant prepreg shown in Table 2 was then laid up 23 plies (initial thickness=1.8 mil/ply) between copper foil and pressed at 250 psi in a vacuum-assisted hydraulic press at a temperature of 220° C. for 2.5 hours. This resulted in a copper laminate having a Dk of 2.8, density of 1.7 g/cc and thickness of 22.7 mil.

EXAMPLE 3

A multi-layer board was designed and built by a large electronics company to operate at high frequency. The board had four circuit layers and four ground planes and was fabricated as two separate stripline circuits, each have two circuit layers and two grounds. The board had to withstand a soldering operation as part of the final assembly.

The board was fabricated with two different lamination processes. The first lamination process involved the traditional approach of using thermoplastic bond plies. Because of the soldering operation, the bonding films selected were FEP, which bonds at 550° F. (288° C.), and 6700, which bonds at 450° F. (232° C.). Bonding at the high temperatures produced warpage and dimensional stability problems during the first lamination and the company was not able to produce a material that met the electrical specifications.

The second lamination process involved the use of the thermosetting bond ply as described in this invention. Bonding at both lamination steps occurred at 428° F. (220° C.). The board was fabricated successfully and was able to withstand the soldering operation during assembly without any degrading of the bonds.

While particular embodiments of the present invention have been illustrated and described herein, the present invention should not be limited to such illustrations and descriptions. It should be apparent that changes and modifications may be incorporated and embodied as part of the present invention within the scope of the following claims.

The invention claimed is:

1. An adhesive sheet which is dimensionally stable when used through more than one bonding cycle under conditions of heat and pressure that comprises:

an expanded polytetrafluoroethylene (PTFE) film containing 9–60 weight percent (based on the weight of the adhesive sheet) ceramic filler, the film including a network of nodes interconnected by fibrils;

said film having a B-stage thermosettable resin adhesive imbibed within the film, said thermosettable resin adhesive consisting of no more than 60% by weight of the adhesive sheet;

the adhesive sheet having a dielectric constant of less than 4 and being readily processable at temperatures of less than 230° C. at a pressure of less than or equal to 250 lbs/in$^2$ (170 N/cm$^2$).

2. The adhesive sheet of claim 1 wherein the thermosettable resin comprises between 5 and 60% by weight of the sheet.

3. The adhesive sheet of claim 1 wherein adhesive joins together at least a first layer and a second layer to form a multi-layered substrate; and the adhesive has a dielectric constant similar to that of the first and second layers.

4. The adhesive sheet of claim 3 wherein the adhesive sheet has a dielectric constant of between 2.5 and 3.4.

5. The adhesive sheet of claim 1 wherein the multi-layer substrate includes at least one metal layer to form a metal-clad substrate.

6. The adhesive sheet of claim 5 wherein one of the layers includes a reinforcement layer.

7. The adhesive sheet of claim 1 wherein adhesive joins together at least a first layer and a second layer to form a multi-layered substrate; and the adhesive has a coefficient of thermal expansion similar to that of the first and second layers.

8. A method for forming a circuit board that comprises:

providing an adhesive sheet which is dimensionally stable when used through more than one bonding cycle under conditions of heat and pressure, said adhesive sheet comprising an expanded polytetrafluoroethylene (PTFE) film containing 9–60 weight percent (based on the weight of the adhesive sheet) ceramic filler, the film including a network of nodes interconnected by fibrils and having a B-stage thermosettable resin adhesive imbibed within the film, the thermosettable resin adhesive consisting of no more than 60% by weight of the adhesive sheet, the adhesive sheet having a dielectric constant of less than 4 and being readily processable at temperatures of less than 230° C. at a pressure of less than or equal to 250 pounds/in$^2$170 N/cm$^2$;

mounting the adhesive sheet between layers of the circuit board; and applying a temperature to the circuit board of less than 230° C. at a pressure of less than or equal to 250 pounds/in$^2$ to cause the adhesive sheet to adhere to and bond together the circuit board layers.

9. The method of claim 8 that further comprises providing a metal conductor as at least one of the components.

10. The method of claim 8 that further comprises providing as the bond film a material with a dielectric constant essentially equal to that of the components.

11. The method of claim 8 that further comprises providing as the bond film a material with a coefficient of thermal expansion essentially equal to that of the components.

12. The method of claim 8 that further comprises providing a reinforcement layer in the circuit board.

* * * * *

UNITED STATES PATENT AND TRADEMARK OFFICE
CERTIFICATE OF CORRECTION

PATENT NO. : 5,652,055

DATED : July 29, 1997

INVENTOR(S) : David R. King, Gary C. Adler, Joseph E. Korleski, Michelle M. H. Waters It is certified that error appears in the above-identified patent and that said Letters Patent is hereby corrected as shown below:

At column 4, line 45, please delete "comes", and insert therefor --come--.
At column 5, line 65, please delete "micron", and insert therefor --microns--.
At column 6, line 3, please delete "added", and insert therefor --dried--.
At column 7, line 58, in table 1, please delete "1.00" under table column "Vp(%)", and insert therefor --100--.

Signed and Sealed this

Third Day of March, 1998

BRUCE LEHMAN

Attest:

*Attesting Officer*

*Commissioner of Patents and Trademarks*